United States Patent [19]
Gierut

[11] Patent Number: 6,122,161
[45] Date of Patent: *Sep. 19, 2000

[54] CIRCUIT BOARD ASSEMBLY

[75] Inventor: Lawrence Gierut, Lockport, Ill.

[73] Assignee: Rockwell Semiconductor Systems, Inc., Newport Beach, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/868,630

[22] Filed: Jun. 4, 1997

Related U.S. Application Data

[63] Continuation-in-part of application No. 08/518,371, Aug. 23, 1995, Pat. No. 5,648,891.

[51] Int. Cl.[7] ........................................................ G06F 1/16
[52] U.S. Cl. .............................. 361/683; 439/65; 439/74; 361/802; 361/788
[58] Field of Search .................................... 361/683, 788, 361/740, 785, 786, 801, 796, 803, 802, 686; 439/65, 61; 211/41.17

[56] References Cited

U.S. PATENT DOCUMENTS

| | | |
|---|---|---|
| 2,951,184 | 8/1960 | Wyma ........................................ 361/788 |
| 4,400,049 | 8/1983 | Schuck ...................................... 439/176 |
| 4,466,049 | 8/1984 | Chaney et al. ........................... 361/686 |
| 4,509,647 | 4/1985 | Shevchuk ................................. 361/736 |
| 4,821,145 | 4/1989 | Corfits et al. ............................. 361/686 |
| 4,840,570 | 6/1989 | Mann, Jr. et al. ......................... 439/74 |
| 5,006,961 | 4/1991 | Monico ..................................... 361/788 |
| 5,030,108 | 7/1991 | Babow et al. ............................. 439/64 |
| 5,062,801 | 11/1991 | Roos ........................................ 361/803 |
| 5,162,978 | 11/1992 | Vogt et al. ............................... 361/801 |
| 5,216,578 | 6/1993 | Zenitani et al. ........................... 361/686 |
| 5,448,699 | 9/1995 | Goss et al. ............................... 361/788 |
| 5,536,176 | 7/1996 | Borchew et al. ......................... 361/788 |
| 5,583,749 | 12/1996 | Tredennick et al. ..................... 361/803 |
| 5,594,621 | 1/1997 | Van Rumpt .............................. 361/686 |
| 5,617,296 | 4/1997 | Melville et al. ......................... 361/736 |
| 5,648,891 | 7/1997 | Gierut ..................................... 361/788 |
| 5,818,696 | 10/1998 | Knoop ..................................... 361/730 |

*Primary Examiner*—Donald Sparks
*Assistant Examiner*—Lisa Lea-Edmonds
*Attorney, Agent, or Firm*—Welsh & Katz, Ltd.

[57] ABSTRACT

A circuit board assembly (10) having a plurality of circuit board subassemblies (12) having a device (14) for releasably electrically and mechanically connecting the subassemblies (12) into a general configuration of a plane, and said subassemblies (12) having a device (16) for electrically and mechanically interconnecting the subassemblies (12) into a system back plane (18).

22 Claims, 1 Drawing Sheet

CIRCUIT BOARD ASSEMBLY

This Application is a continuation-in-part of U.S. patent application Ser. No. 08/518,371, filed Aug. 23, 1995 and now U.S. Pat. No. 5,648,891.

FIELD OF THE INVENTION

The present invention relates to circuit boards, and more particularly to circuit boards assemblies.

BACKGROUND OF THE INVENTION

Before the present invention, circuit board assemblies have been known. However, in some cases a relatively large circuit board may be required for some assemblies, such as 30 inches by 12 inches. Although this may be the ideal size of the boards for certain uses, the large boards encounter many difficulties.

First, the larger and more complex a circuit board assembly may be, it is more difficult to test the board for errors. Large boards are more difficult to assemble and test on available production fixtures and the tooling available. Also, the large boards have a tendency to warp, and therefor become a quality problem. The large boards tend to flex and thus can't be used with certain components without introducing potential quality problems due to cracked components and loose solder joints.

In addition, subsets of the board design may need to be upgradable because the technology has changed, but replacing the large boards for this purpose can be very costly. Design modifications may need to be made on a subset of the main assembly which may cause scrapping of the whole assembly. Such methods of using the boards may also thicken the board thereby occupying more than one slot in a system back plane.

SUMMARY OF THE PRESENT INVENTION

A principal feature of the present invention is the provision of an improved circuit board assembly.

A circuit board assembly for use with a backplane connector, comprising a generally planar plurality of circuit boards, each aligned to occupy a common plane, with the plurality of circuit boards together forming a generally rectangular circuit board assembly; a first rigid structural member disposed along a first edge of the generally rectangular circuit board assembly of circuit boards and rigidly secured to each circuit board of the plurality of circuit boards; a second rigid structural member disposed along an opposing second edge of the generally rectangular circuit board assembly of circuit boards and rigidly secured to each circuit board of the plurality of circuit boards; an electrical connector disposed on each circuit board, with an axis of engagement of each electrical connector disposed outwardly from the first edge of the circuit board assembly in a single common direction and which engages the backplane connector; and a connector pair joining at least a first and second circuit board of the plurality of circuit boards.

A feature of the invention is that the circuit boards are mechanically and electrically connected together, while reducing the size substantially of each subassembly as compared to the whole assembly.

Another feature of the invention is that the connected circuit boards are mechanically and electrically connected to a system back plane, A feature of the invention is that the smaller circuit boards alleviate the problem of warping.

Another feature of the invention is that since the circuit boards are smaller and contain less components, the subassemblies are easier to trouble shoot than the whole assembly at once.

Still another feature of the invention is that each circuit board may be replaced during an upgrade or design modification without affecting the whole assembly.

Yet another feature of the invention is that the connecting means comprises electrically conductive pin connectors, Another feature of the invention is that different logical components may be introduced into each circuit board, such as one module containing a main system interface, another module may be a processor core, and a third module may be a combination of a memory module and hard disk controller or any other type of common peripheral device.

Further features will become more fully apparent from the following detailed description of the embodiments of this invention, and from the appended claims.

DETAILED DESCRIPTION OF A PREFERRED EMBODIMENT

Figure 1:
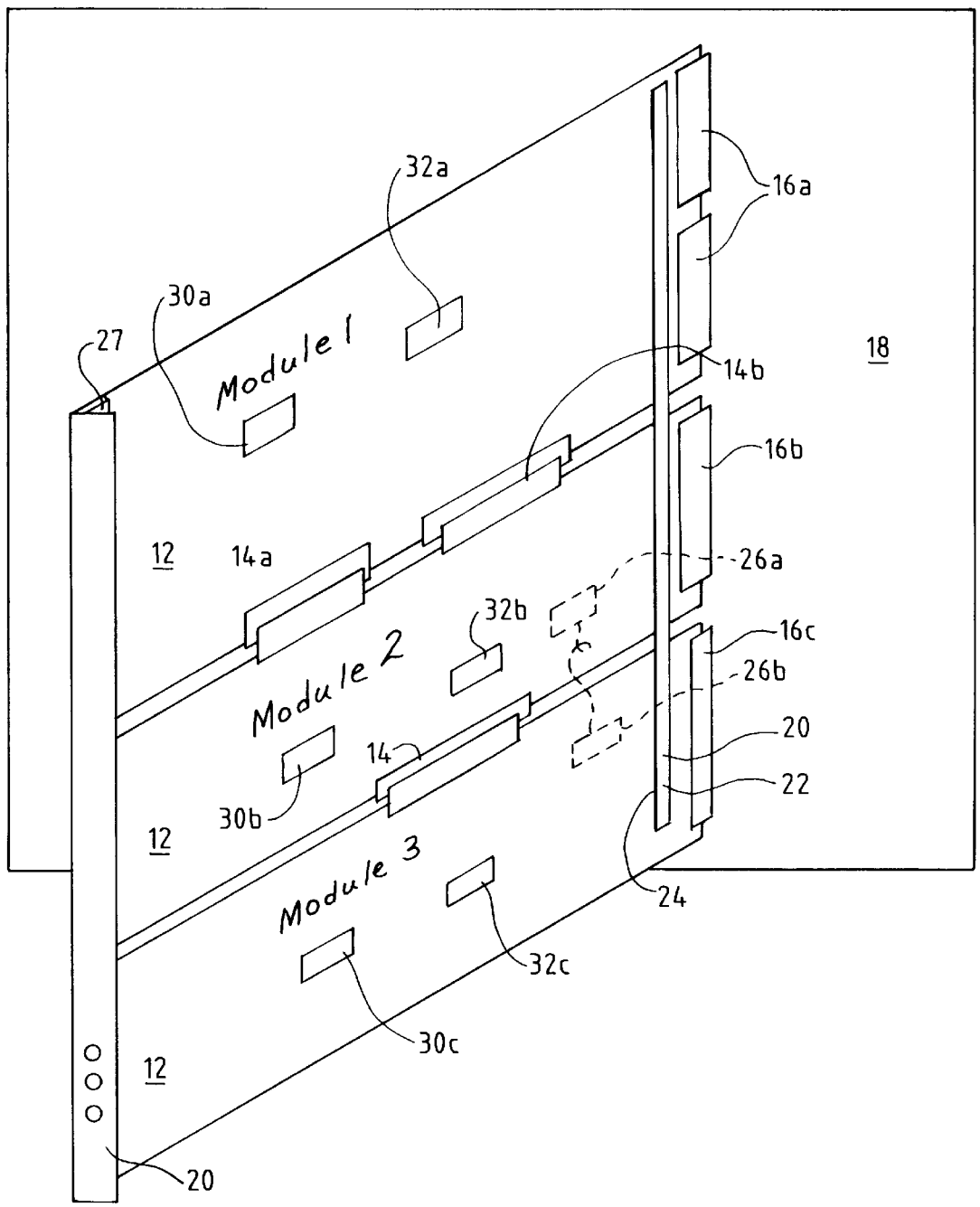
FIG. 1 is a diagrammatic perspective view of a circuit board assembly of the present invention.

Referring now to FIG. 1, there is shown an electric circuit board assembly generally designated 10. The assembly 10 has a plurality of electric circuit board subassemblies or modules 12. The subassemblies have a plurality of electrically conductive pin connectors 14 which electrically and mechanically releasably connect the subassemblies 12 together in the general configuration of a plane.

The pin connectors 14 may be single pin male-female, or any appropriate multi-pin male-female electrical connector. For example, connector 14a may include a male card edge connector affixed to module 1 and a mating female card edge connector affixed to module 2, or visa versa. Connector 14b could be a BNC-type connector.

The subassemblies 12 also have a plurality of electrically conductive pin connectors 16 which electrically and mechanically releasably connect the assembled subassemblies 12 into a system back plane 18, The assembly 10 has one or more brackets 20 which releasably retain the subassemblies 12 in the assembled relationship, and provide strength and stability to the assembly 10 when assembled with the subassemblies 12. For example, the brackets 20 may have a backing 22 having a suitable adhesive 24 to releasable interlock the brackets 20 to the assembly 10. Alternatively, the brackets 20 and subassemblies 12 may be assembled into the board assembly 10 using nuts and bolts 27.

The circuit board assembly 10 may be fabricated to accomplish a specific integrated function, or may be made up of a number of special purpose subassemblies 12. For example, the assembly 10 may be part of a data processing system including a microprocessor 30b on a first subassembly 12 (module 2), a memory 30b on a second subassembly 12 (module 1), and a modem 30c on a third subassembly 12 (module 3).

Communications between the microprocessor 30b on module 2 and the memory 30a on module 1 may be accomplished over a set of electrical connectors 14a, 14b. Writing to memory 30a may be accomplished over a first connector 14a. Reading from memory 30a may be accomplished over a second connector 14b.

Communications between the microprocessor 30b on module 2 and the modem 30c on module 3 may be accomplished over the interconnect 14c. External communications may be accomplished with an interconnection 16c between the modem 30c on module 3 and an external telephone connection provided through the backplane 18.

The microprocessor 30b may communicate with other microprocessors (not shown) of the data processing system through its connection 16b with the backplane. Alternatively, the other processors may be given access to the memory 30a or modem 30c through other backplane connectors 16a, 16c.

Alternatively, the modules 12 may all be individually accessible memory boards connected to a common bus located within the backplane 18. In such case, memory access (read and write) and chip select functions may be accomplished by direct connection through the pin connectors 16.

The circuit board assembly 10 may also form an integrated memory array. The READ/WRITE connections of memory modules 30a, 30b, 30c may be interconnected with a read/write bus in the backplane individually through connectors 16a, 16b, 16c or through a single designated connector (e.g., 16b). A device (chip) select may be accomplished by a separate chip select circuit 32a, 32b, 32c on each subassembly 12 or by a common chip select 32b and by a common circuit connection to the address bus in the backplane 18 through the connector 16b. Individual chip select connections may be carried to the individual memory chips 30a, 30c on modules 1 and 3 through side connectors 14a, 14b, 14c. Alternatively, one of the subassemblies 12 may contain a hard disk drive 30c, while other subassemblies 12 may contain random access memory (RAM) 30a, 30b. Device selection may be accomplished either directly through backplane connectors 16a, 16b, 16c or through a central modules 2 and distributed to the individual devices through the side connectors 14a, 14b, 14c.

In another embodiment of the invention, connectivity may be enhanced by auxiliary connectors 26 located on different boards of the system 10. The auxiliary connectors 26 could be flat cable connector sockets mounted on adjacent modules interconnected by plugs on opposing ends of a short flat cable. PCMCIA connector technology may also be used. Fiber optic cables and connectors 26 may also be used.

In another embodiment of the invention, the overall dimension of the circuit board assembly 10 may be compatible with a card slot of an IBM PC (or IBM PC compatible) computer. As the technology of circuit boards of the IBM PC advances, the single large board in each card slot may be replaced with the circuit board assembly 10 of two or more subassemblies 12.

In another embodiment, where board technology improves (and it becomes possible to combine the CPU and memory of modules 1 and 2 of prior examples into a single subassembly 12 (e.g., module 2), then the vacated module (e.g., module 1) may be used for other purposes. For example, a coprocessor may now be located on module 1 to improve the power and functionality of the data processing system located on the board system 10. Where a coprocessor 30a is now located on module 1, communication may be maintained with the main processor 30b over intervening connectors 14a. Auxiliary memory (e.g., read only memory (ROM) 32a) may now be located on the previously vacated subassembly for storing program instructions of the new coprocessor 30a.

Thus, in accordance with the present invention, a large circuit board assembly 10 is provided with a plurality of assembled subassemblies 12. In this configuration, the assembly has no hidden components, and is easier to trouble shoot for errors as compared to one large circuit board. Moreover, in the event of changes to the electrical components, only one of the subassemblies 12 may need be replaced, while keeping the remaining subassemblies 12 intact.

The foregoing detailed description has been given for clearness of understanding only, and no unnecessary limitations should be understood therefrom, as modification will be obvious to those skilled in the art.

What is claimed is:

1. A circuit board assembly for use with a backplane connector, comprising:

a generally planar plurality of circuit boards, each aligned to occupy a common plane, with the plurality of circuit boards together forming a generally rectangular circuit board assembly;

a first rigid structural member disposed along and lying parallel to a first edge of the generally rectangular circuit board assembly of circuit boards and rigidly secured to each circuit board of the plurality of circuit boards;

a second rigid structural member disposed along and lying parallel to an opposing second edge of the generally rectangular circuit board assembly of circuit boards and rigidly secured to each circuit board of the plurality of circuit boards;

an electric connector disposed on each circuit board along the first edge, with an axis of engagement of each electrical connector disposed outwardly from the first and second structural members of the circuit board assembly in a single common direction along a line perpendicular to the first and second rigid structural members; and a electrical connector pair directly joining at least a first and second circuit board of the plurality of circuit boards along a common edge parallel to the axis of engagement of the electrical connectors of the first edge of the circuit board assembly.

2. The circuit board assembly as in claim 1 further comprising a microprocessor disposed on a first circuit board of the plurality of circuit boards.

3. The circuit board assembly as claim 2 further comprising a memory disposed on a second circuit board of the plurality of circuit boards and interconnected with the microprocessor through the connector pair joining the first and second circuit boards.

4. The circuit board assembly as in claim 3 further comprising a hard disk drive disposed on a third circuit board of the plurality of circuit boards and interconnected with the microprocessor through a connector pair joining the first and third circuit boards.

5. The circuit board assembly as in claim 3 further comprising a modem disposed on a third circuit board of the plurality of circuit boards and interconnected with the microprocessor through a connector pair joining the first and third circuit boards.

6. The circuit board assembly as in claim 2 further comprising a coprocessor disposed on a second circuit board of the plurality of circuit boards.

7. The circuit board assembly as in claim 1 further comprising a memory array.

8. The circuit board assembly as in claim 7 further comprising a memory chip with a device select input disposed on a circuit board of the plurality of circuit boards.

9. The circuit board assembly as in claim 8 further comprising a device select circuit on a second circuit board of the plurality of circuit boards and interconnected with the device select input of the memory chip through the connector pair joining the first and second circuit boards.

10. The circuit board assembly as in claim 1 further comprising a hard disk drive disposed on a second circuit board of the plurality of circuit boards.

11. A circuit board assembly for use with a backplane connector, comprising:

a generally planar plurality of circuit boards each with a connector and each aligned to occupy a common plane, with the plurality of circuit boards together forming a generally rectangular circuit board assembly; and means for substantially simultaneously directly engaging the connector on each circuit board of the plurality of circuit boards of the circuit board assembly with the backplane connector.

12. The circuit board as in claim 11 further comprising a connector pair directly joining a first and a second circuit board of the plurality of circuit boards.

13. The circuit board as in claim 12 further comprising a microprocessor disposed on the first circuit board of the plurality of circuit boards.

14. The circuit board assembly as in claim 13 further comprising a memory disposed on a second circuit board of the plurality of circuit boards and interconnected with the microprocessor through the connector pair joining the first and second circuit boards.

15. The circuit board assembly as in claim 14 further comprising a coprocessor disposed on the second circuit board of the plurality of circuit boards.

16. The circuit board assembly as in claim 11 further comprising a memory array.

17. The circuit board assembly as in claim 11 wherein the means for directly engaging further comprises at least one structural member rigidly secured to each circuit board of the plurality of circuit boards.

18. A circuit board assembly for use with a backplane connector, comprising:

a plurality of circuit boards, each having an electrical connector;

means for substantially simultaneously directly engaging the electrical connector of each circuit board of the plurality of circuit boards of the circuit board assembly with the backplane connector.

19. The circuit board assembly as in claim 18 further comprising a connector pair directly joining a first and a second circuit board of the plurality of circuit boards.

20. The circuit board assembly as in claim 19 further comprising a microprocessor disposed on the first circuit board of the plurality of circuit boards.

21. The circuit board assembly as in claim 20 further comprising a memory disposed on a second circuit board of the plurality of circuit boards and interconnected with the microprocessor through the connector pair joining the first and second circuit boards.

22. The circuit board assembly as in claim 18 wherein the means for directly engaging further comprises at least one structural member rigidly secured to each circuit board of the plurality of circuit boards.

* * * * *